United States Patent
Suto et al.

(10) Patent No.: US 6,480,993 B1
(45) Date of Patent: Nov. 12, 2002

(54) ACCURATE LAYOUT MODELING FOR CENTERLINE-BASED DETAIL ROUTING

(75) Inventors: Gyorgy Suto, Hillsboro, OR (US); Eric Todd, San Francisco, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/473,282

(22) Filed: Dec. 28, 1999

(51) Int. Cl.[7] .............................................. G06F 17/50
(52) U.S. Cl. .............................. 716/10; 716/8; 716/11; 716/14; 716/16
(58) Field of Search ............................... 716/8, 14, 10, 716/11, 16

(56) References Cited

U.S. PATENT DOCUMENTS 5,659,484 A * 8/1997 Bennett et al. ............... 716/16
5,910,899 A * 6/1999 Barrientos .................... 716/11
6,209,123 B1 * 3/2001 Maziasz ....................... 716/14

* cited by examiner

Primary Examiner—Vuthe Siek
Assistant Examiner—Thuan Do
(74) Attorney, Agent, or Firm—Schwegman, Lundberg, Woessner & Kluth, P.A.

(57) ABSTRACT

Some embodiments of the invention include a computerize method of modeling a layout for a circuit design comprising receiving a plurality of circuit elements and receiving a plurality of design rules for a layout comprising the plurality of circuit elements. The computerized method further includes generating a layout model through computer automated operations wherein one or more constraints corresponding to the design rules effective at each point in a search space of the layout model are indicated by a color associated with the point.

20 Claims, 7 Drawing Sheets

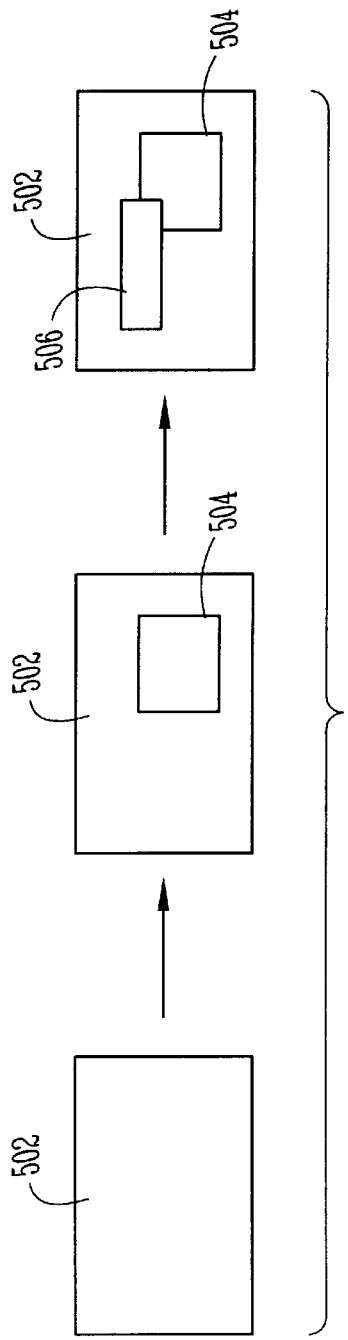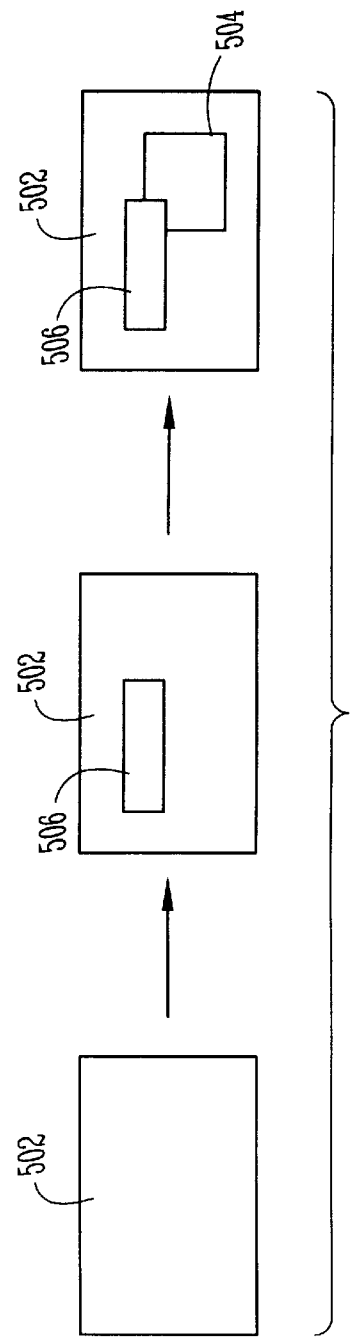

ACCURATE LAYOUT MODELING FOR CENTERLINE-BASED DETAIL ROUTING

FIELD OF THE INVENTION

The present invention is related to computer-aided design, and more particularly to computer-aided design systems for detail routing of integrated circuits.

BACKGROUND INFORMATION

Integrated circuits comprise a collection of components, including but not limited to transistors, resistors, and capacitors, fabricated on a semiconductor substrate. The components are connected with metal interconnections, called wires, to form a system such as a microprocessor. Integrated circuit performance has been improving because the components and the wires are being fabricated in smaller sizes to increase the density of the integrated circuits. However, as the density of the integrated circuits increase, the complexity also increases. Most integrated circuits are so complex that it is no longer reasonable to use manual design techniques to design them; rather, computer-aided design (CAD) systems are used to aid in the design of such integrated circuits.

Some of the functions generally performed by a CAD system include, but are not limited to, placement, global routing and detail routing of integrated circuit elements. When placing elements of an integrated circuit in a layout, the CAD system attempts to make intelligent decisions about where connectors to the circuit element should be located and also about how the circuit elements should be oriented or positioned relative to one another. After placement of the circuit elements, the next act performed by the CAD system is typically global routing of the circuit elements. Global routing attempts to logically determine what general path each interconnection is going to take. Global routing decisions are made based on the available avenues formed by the placement of the circuit elements and are assigned in consideration of the various costs (i.e. such as to incur the shortest amount of interconnect between the connectors.) After the global router has assigned the general flow of interconnect lines, a detail router takes over and actually attempts to make the interconnect lines fit the assignments made by the global router. The detail router attempts to comply with the design rules for the circuit.

Generally, the detail routing process has three phases. In the first phase, the search space is modeled. The search space is the area available for the circuit layout. In the second phase, the actual search for a best route takes place using the model of the search space created in the first phase. In the third phase, a ripup and reroute strategy is applied to either clean up any design-rule violations and/or complete the unrouted nets.

The model of the search space used by a detail router includes obstacles and their relationships. Examples of obstacles include, but are not limited to, circuit elements, contacts that cannot be crossed, or wires that have already been routed. The obstacles need to be modeled in such a way that the subsequent search is convenient and that ensures design rule correctness of the resulting layout.

The layout models previously used by detail routers are very simplistic. Generally, the layout models divide topologically the search space into black and white regions. A white region is a permitted location for routing. A black region is a forbidden location for routing. Such a simplistic layout model has several disadvantages. For example, such a layout model does not effectively use all of the search space to route connections. Furthermore, it is difficult to model sophisticated design rules required by modern VLSI systems using such a simple model.

For these and other reasons, there is a need for the present invention.

SUMMARY OF THE INVENTION

Some embodiments of the invention include a computerized method of modeling a layout for a circuit design comprising receiving a plurality of circuit elements and receiving a plurality of design rules for a layout comprising the plurality of circuit elements. The computerized method further includes generating a layout model through computer automated operations wherein one or more constraints corresponding to the plurality of design rules effective at each point in a search space of the layout model are indicated by a color associated with the point.

Other embodiments are described and claimed.

BRIEF DESCRIPTION OF THE DRAWINGS

FIGS. 5A and 5B are block diagrams illustrating the color precedence rules as applied in one embodiment of the invention.

DESCRIPTION OF THE PREFERRED EMBODIMENTS

Systems for and methods of accurate layout modeling for centerline-based detail routing are described. In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

The embodiments of novel layout modeling systems and methods described below achieve high layout density and design-rule correct routing by using a novel coloring scheme to represent design constraints and by applying color precedence rules within the novel coloring scheme as described in more detail below.

Hardware and Operating Environment

Figure 1:
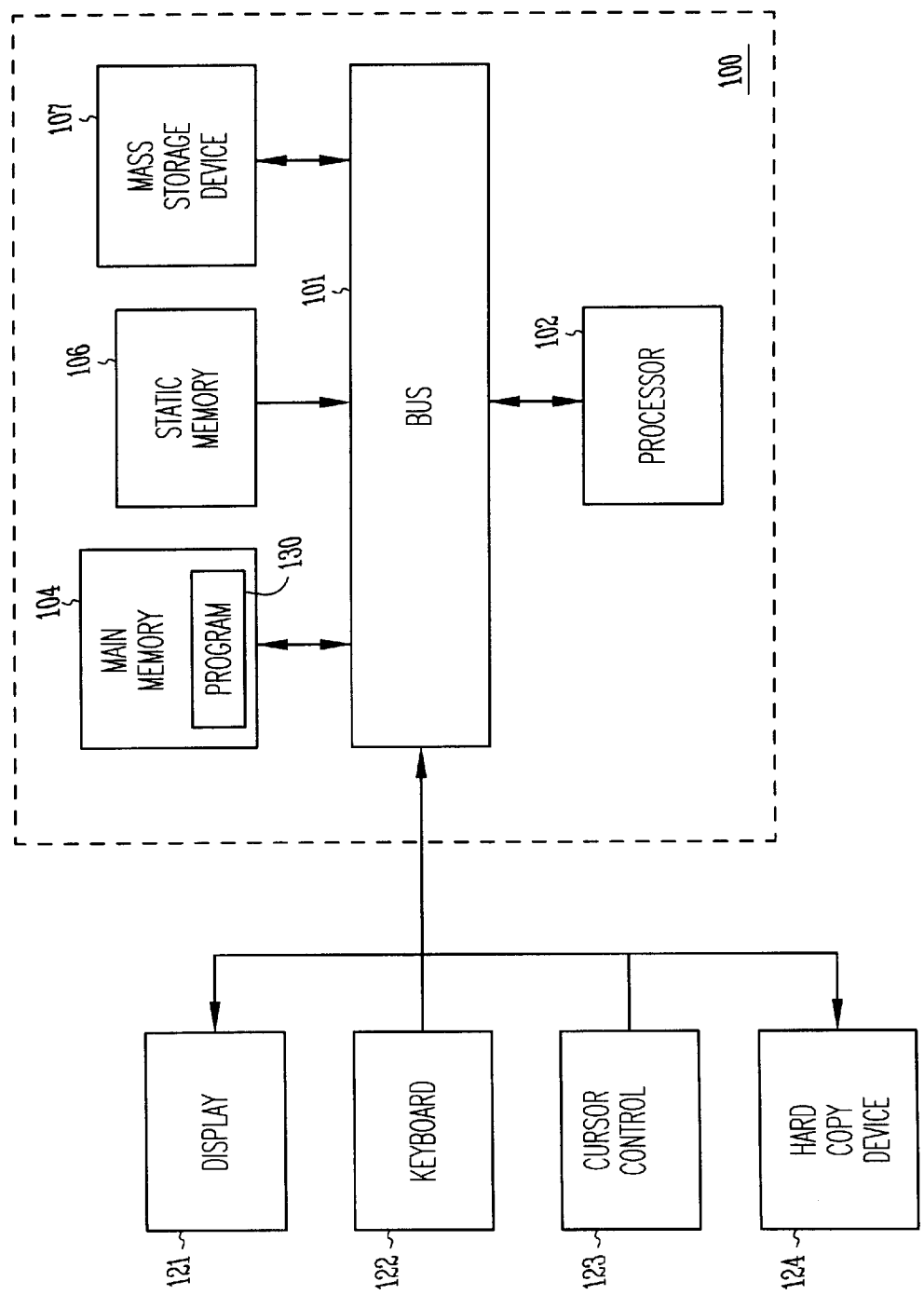
FIG. 1 is a block diagram of a typical hardware and operating environment in conjunction with which embodiments of the invention may be implemented.

FIG. 1 is a diagram of a typical hardware and operating environment in conjunction with which embodiments of the invention are implemented. Computer system 100 comprises a bus or other communication means 101 for communicating information, and a processor 102 coupled with bus 101 for processing information. Computer system 100 further comprises a random access memory (RAM) or other dynamic storage device 104 (referred to as main memory), coupled to bus 101 for storing information and instructions to be executed by processor 102. Main memory 104 also may be used for storing temporary variables or other intermediate information during execution of computer-aided design programs 130 by processor 102. Computer system 100 also comprises a read only memory (ROM) and/or other static storage device 106 coupled to bus 101 for storing static information and instructions for processor 102, and a data storage device 107 such as a magnetic disk or optical disk and its corresponding disk drive. Data storage device 107 is coupled to bus 101 for storing information and instructions for modeling a layout of a circuit design. Computer system 100 may further be coupled to a display device 121, such as a cathode ray tube (CRT) or liquid crystal display (LCD) coupled to bus 101 for displaying a layout model to a computer user. An alphanumeric input device 122, including alphanumeric and other keys, may also be coupled to bus 101 for communicating information and command selections to processor 102. An additional user input device may be cursor control device 123, such as a mouse, trackball, stylus, or cursor direction keys, coupled to bus 101 for communicating direction information and command selections to processor 102, and for controlling cursor movement on display 121. Another device which may be coupled to bus 101 is hard copy device 124 which may be used for printing instructions, data, or other information on a medium such as paper, film, or similar types of media. Note, also, that any or all of the components of computer system 100 and associated hardware may be used in one embodiment, however, it can be appreciated that any type of configuration of the system may be used for various purposes as the user requires in other embodiments.

Computer-readable instructions stored on a computer-readable medium are executable by the processor 102 of computer system 100. A hard drive, CD-ROM, and RAM are some examples of articles including a computer-readable medium. For example, a computer-aided design program 130 performing layout modeling for centerline based detail routing may be included on a CD-ROM and loaded from the CD-ROM to a hard drive. The computer-readable instructions cause the computer system 100 to perform methods of automated detail routing as further described below.

System Level Overview

Figure 2:
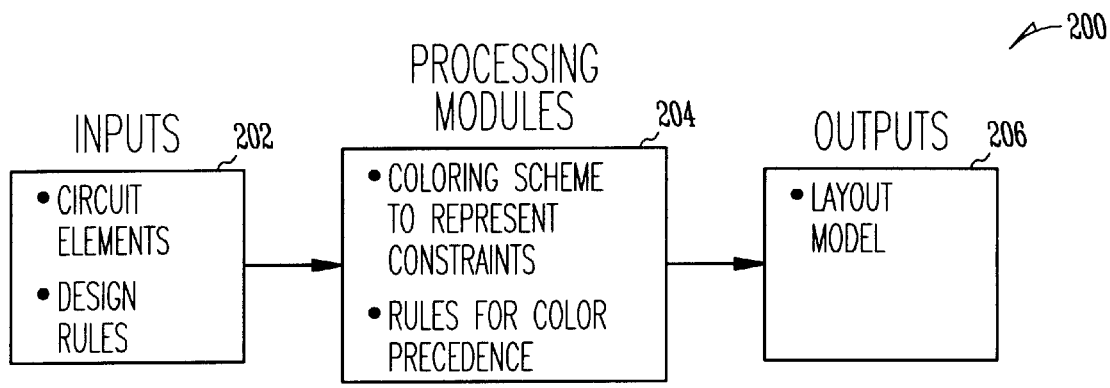
FIG. 2 is a high-level block diagram of one embodiment of a computer automated detail routing system according to one embodiment of the invention.

A system level overview of one embodiment of the present invention is described by reference to FIG. 2. FIG. 2 is a block diagram of a computer automated detail routing system 200. The computer automated detail routing system shown in FIG. 2 comprises inputs 202, processing modules 204 and one or more outputs 206.

In one embodiment, the inputs 202 comprise a plurality of elements of an integrated circuit and one or more design rules for the layout of the integrated circuit. In one embodiment, the plurality of integrated circuit elements are received in the form of a net list.

The processing modules 204 comprise program modules that perform the functions for computer automated detail routing. Generally, program modules include routines, programs, objects, components, data structures, etc., that perform particular functions or implement particular abstract data types. In one embodiment, the processing modules 204 apply a novel coloring scheme to represent design constraints in a layout model for an integrated circuit. In another embodiment, the processing modules 204 also apply color precedence rules within the novel coloring scheme.

In an alternate embodiment, the processing modules 204 perform additional detail routing functions such as searching for a best route in a given layout model. In one embodiment, the processing modules 204 allow searching for only design rule correct routes in the layout model. In another embodiment, the processing modules 204 also allow searching for routes in the layout model that may violate one or more of the design rules. In this case, the processing modules 204 also model the gradients of violations of the design rules. In still another embodiment, the processing modules 204 also perform ripup and reroute functions.

One output 206 of the computer automated layout modeling system 200 is a layout model in which the design constraints that apply to each one of the points in the search space are indicated by the color that covers the point in the search space. In one embodiment, the layout model 206 generated by the processing modules 204 provides accurate layout modeling for center-line based detail routing.

A method of modeling a layout of an integrated circuit according to one embodiment of the present invention ensures that searching the layout model will produce a path that is design rule correct. Furthermore, if desired, another embodiment of the method of modeling a layout of an integrated circuit allows modeling of violations of design rules which aid in rip up and reroute strategies.

Additional inputs, functions of the processing modules, and outputs will be readily apparent from the following detailed description.

Methods of the Invention

In the previous section, a system level overview of the operation of an example embodiment of the invention was described. In this section, the particular methods performed by a processor, such as the processor 102 of FIG. 1, in an example embodiment are described by reference to a series of flowcharts and diagrams. The methods to be performed constitute computer programs made up of computer-executable instructions. The methods shown in FIGS. 3–8 are implemented in connection with a machine readable medium comprising machine readable instructions for causing a computer to perform the method. Such machine readable medium may include software modules and computer programs. The computer programs comprise multiple modules or objects to perform the methods, or the functions of the processing modules in the computer automated detail routing system of FIG. 2. The type of computer programming languages used to write the code may vary from procedural code type languages to object oriented languages. The files or objects need not have a one to one correspondence to the modules or method steps described depending on the desires of the programmer. Further, the method and apparatus may comprise combinations of software, hardware and firmware. Describing the methods by reference to flowcharts enables one skilled in the art to develop such programs including such instructions to carry out the methods on suitable computerized systems.

A major drawback of current layout modeling methods for detail routing is that the techniques are too simplistic to model sophisticated design rules for complex layouts such as microprocessor layouts. However, the layout modeling methods according to embodiments of the present invention make accurate modeling of sophisticated design rules possible for detail routing. The novel layout modeling methods, according to some embodiments of the invention, achieve design rule correct routing by using a novel color scheme to represent design rule constraints and by applying color precedence rules within the color scheme as described in more detail below. Some embodiments of the present invention include a coloring scheme to model the various types of information that pertain to a three-dimensional location (x, y, z) in the search space.

Figure 3:
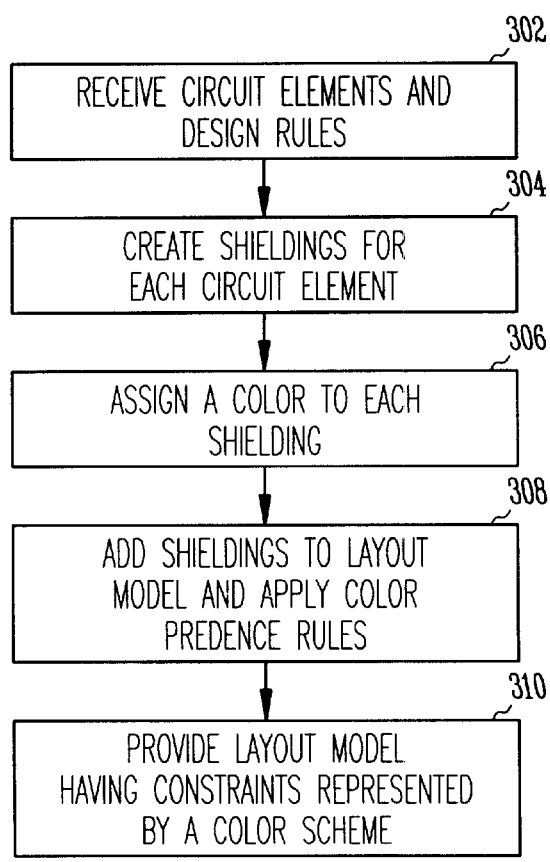
FIG. 3 is a high level flowchart of a method of modeling a layout of an integrated circuit according to one embodiment of the invention.

FIG. 3 is a high level flowchart of a method of modeling a layout for components of an integrated circuit according to one embodiment of the present invention. In the embodiment shown in FIG. 3, the method begins by receiving the circuit elements and the design rules (block 302). In one embodiment, the circuit elements are received in the form of a net list. One or more shieldings are created for each element of the integrated circuit (block 304). A color is assigned to each one of the shieldings according to a color scheme further described below (block 306). The shieldings are added to a layout model of the integrated circuit and the precedence rules of one embodiment of the invention are applied (block 308). Finally, a layout model is provided in which the design rule constraints at any point in the model are indicated by the color of the point in the model (block 310). The following description further elaborates on the blocks of FIG. 3.

According to an example embodiment of the invention, a method of generating a layout model includes creating one or more shieldings for each circuit element as indicated in block 304 of FIG. 3. A shielding (also referred to herein as a shield) is a geometric representation that covers a subarea of the search space. One or more shields are associated with each one of the circuit elements. Certain design rule constraints apply within a shield. Each shield is assigned a color that corresponds to the constraint or constraints that apply within the shield. For example, a first shield is assigned a first color. The example constraint that applies within the first shield is a spacing rule for a read-only object such as a terminal. In this example embodiment, a read-only object is an object that cannot be modified by the detail router. A second shield is assigned a second color. The example constraint that applies within the second shield is a spacing rule for a read-write object such as a wire. In this example embodiment, a read-write object is an object that can be ripped up and rerouted (such as a wire or a via) by the detail router.

Figure 4:
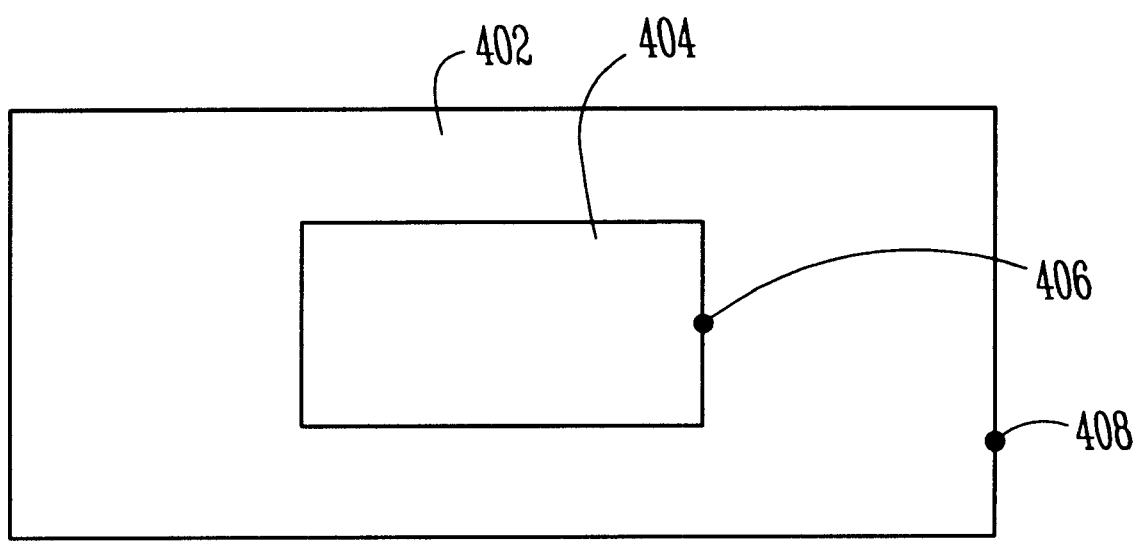
FIG. 4 is a block diagram of two overlapping shields according to one embodiment of the invention.

As stated above, a shield is a geometric representation that covers a subarea of the search space and the shield is associated with one of the circuit elements. In one embodiment, the coloring assigned to a shield applies to the area inside the geometric representation of the shield, but not to the boundary of the geometric representation. FIG. 4 is a block diagram of two overlapping shields. Shield one 402 is represented by a first color. Shield two 404 is represented by a second color. The design rule constraints that apply within shield two 404, for example, apply to the region represented by the second color within shield two 404, but not to the boundary 406 of shield two. Different design rule constraints apply to the boundary 406 of shield two and the region of shield one 402 represented by the first color. However, the different design rule constraints do not apply to the boundary 408 of shield one in this example embodiment.

In one embodiment, design rule constraints that apply to a particular layout are grouped into mutually independent colors (referred to herein as primary colors.) Each primary color has various degrees of saturation from zero (the lowest) to higher numbers. A higher degree of saturation indicates a greater degree of violation of the design rule or rules (i.e. more constraining). A lower degree of saturation is less constraining. In one embodiment of the color scheme of the present invention, a higher degree of saturation takes precedence over a lower degree of saturation as described below.

In one embodiment, when the shieldings described above are added to a layout model, color precedence rules are applied to overlapping shields of the same color as indicated in block 308 of FIG. 3. FIGS. 5A and 5B illustrate the precedence rules that are applied to different saturation levels within a color according to one embodiment of the invention. The objects in FIGS. 5A and 5B are assigned a color P1 and a saturation level of 0, 1, 2 or 3. In one embodiment, when a subarea of a search space is overlapped by two shields having the same color, but different saturations, the higher of the two saturations will be assigned to the color in that sub-region. For example, as shown in FIG. 5A, a first shield 502 of color P1 and saturation level one is applied to a subarea of a search space. Then, a second shield 504 of color P1 and saturation level two is applied over a portion of the first shield of saturation level one. Because the second shield 504 has a greater saturation level, the subarea covered by both the first shield 502 and the second shield 504 is covered with the greater saturation level of color P1 (i.e. level two). Then, a third shield 506 of color P1 and saturation level three is applied over a portion of the first shield 502 and a portion of the second shield 504. Because the third shield 506 has a greater saturation level (i.e. level three) than both the first shield 502 and the second shield 504, the subarea of the search space covered by the third shield 506 will be covered with the color P1 of saturation level three.

In one embodiment, the color of a subarea of a search space is independent of the order in which the shields are applied to the search space. For example, the same shields that were applied to the search space in FIG. 5A are applied to the search space in FIG. 5B, but in a different order. As shown in FIGS. 5A and 5B, the color of the subareas after all three shields are applied is the same in FIGS. 5A and 5B even though the shields were applied in a different order. As shown in FIG. 5B, a first shield 502 of color P1 and saturation level one is again applied to a subarea of a search space. However, in this example a second shield 506 of color P1 and saturation level three is applied over a portion of the first shield 502 of saturation level one. Again, the area covered by both the first shield 502 and the second shield 506 is covered with the greater saturation level of color P1 which is saturation level 3 in FIG. 5B. Then, a third shield 504 of color P1 and saturation level two is applied over a portion of the first shield 502 and the second shield 506. In this case, because the second shield 506 has a greater saturation level (level three) than the third shield 504, the subarea covered by the second shield 506 of saturation level three remains unchanged (ie, color P1 and saturation level three). However, the subarea covered by just the first shield 502 and the third shield 504 is assigned saturation level two because that is the greater saturation level.

In an alternate embodiment, the precedence rules described by reference to FIGS. 5A and 5B are also applied to the relationship between colors as well as to saturation levels within a color. In such an alternate embodiment, the colors assigned to shieldings have a precedence relationship with each other. Any color is either stronger or weaker than any other color. If a previously colored subarea of a search space has a different second color applied to the same subarea or (portion of the subarea) and the previous color is the weaker color, then the color of the subarea changes to the new stronger color. Otherwise, the color of the subarea is unchanged.

Figure 6:
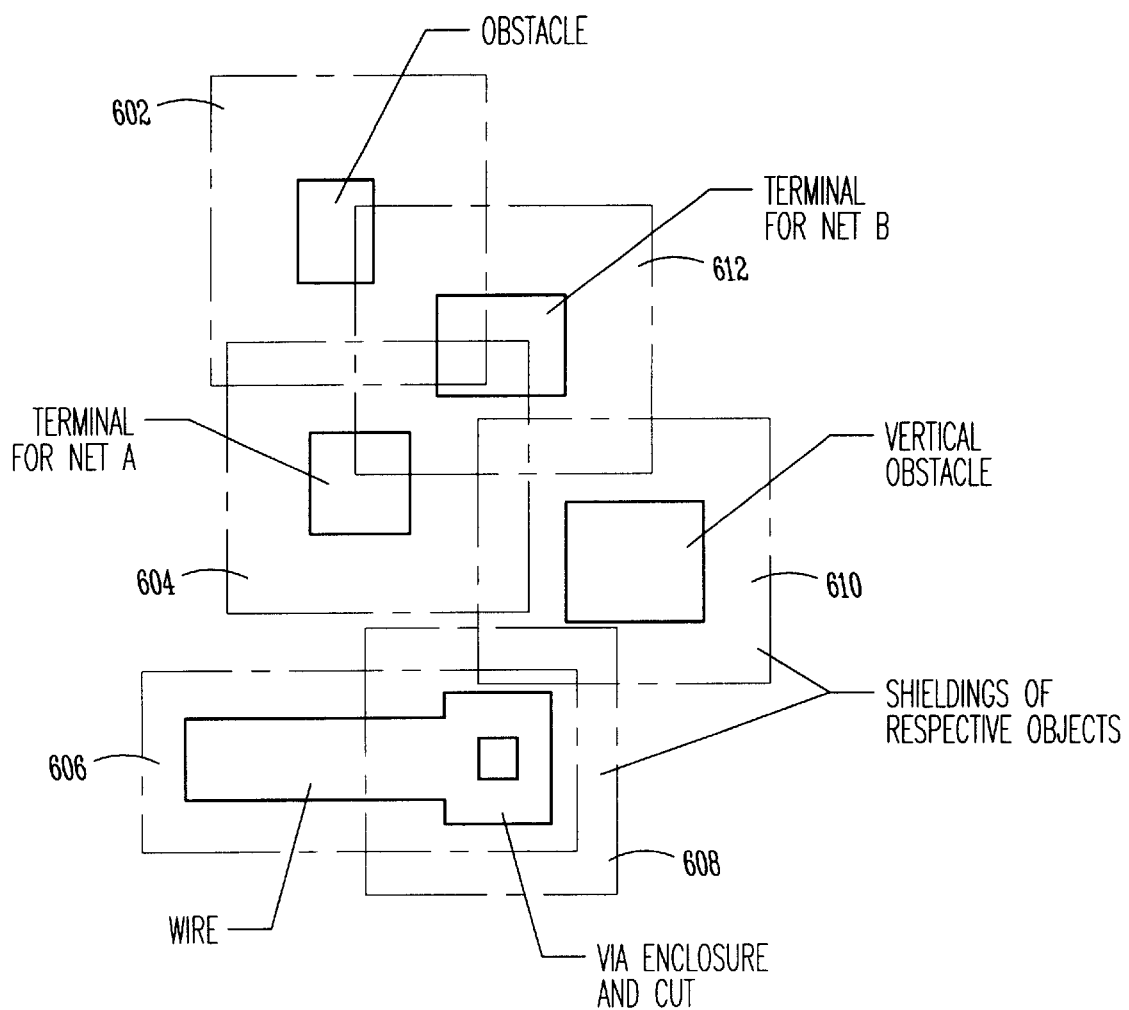
FIG. 6 is a block diagram of layout objects and their associated shieldings according to one embodiment of the present invention.
Figure 7:
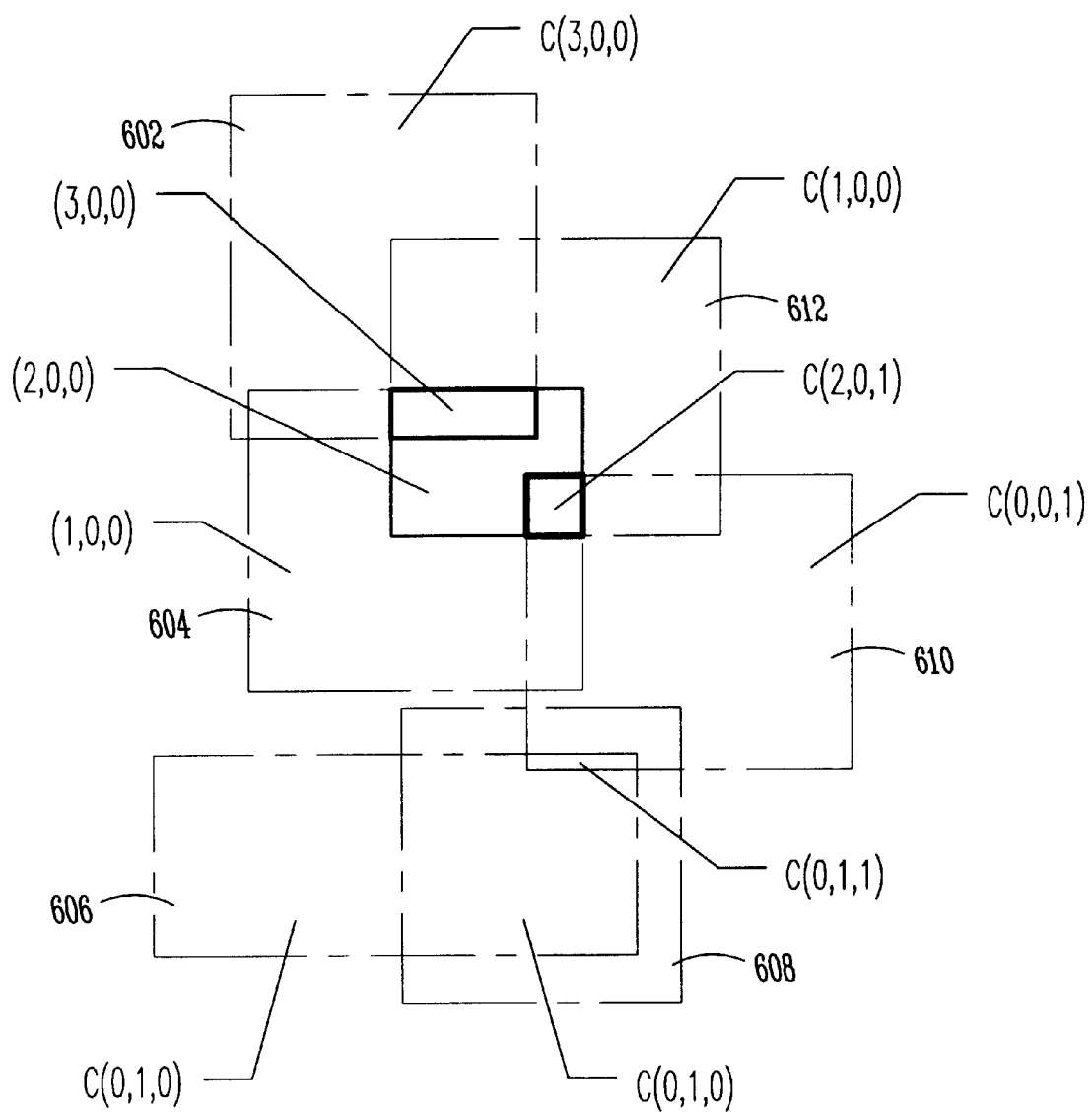
FIG. 7 is a block diagram of the shieldings shown in FIG. 6 and the color associated with the shielding according to one embodiment of the invention.
Figure 8:
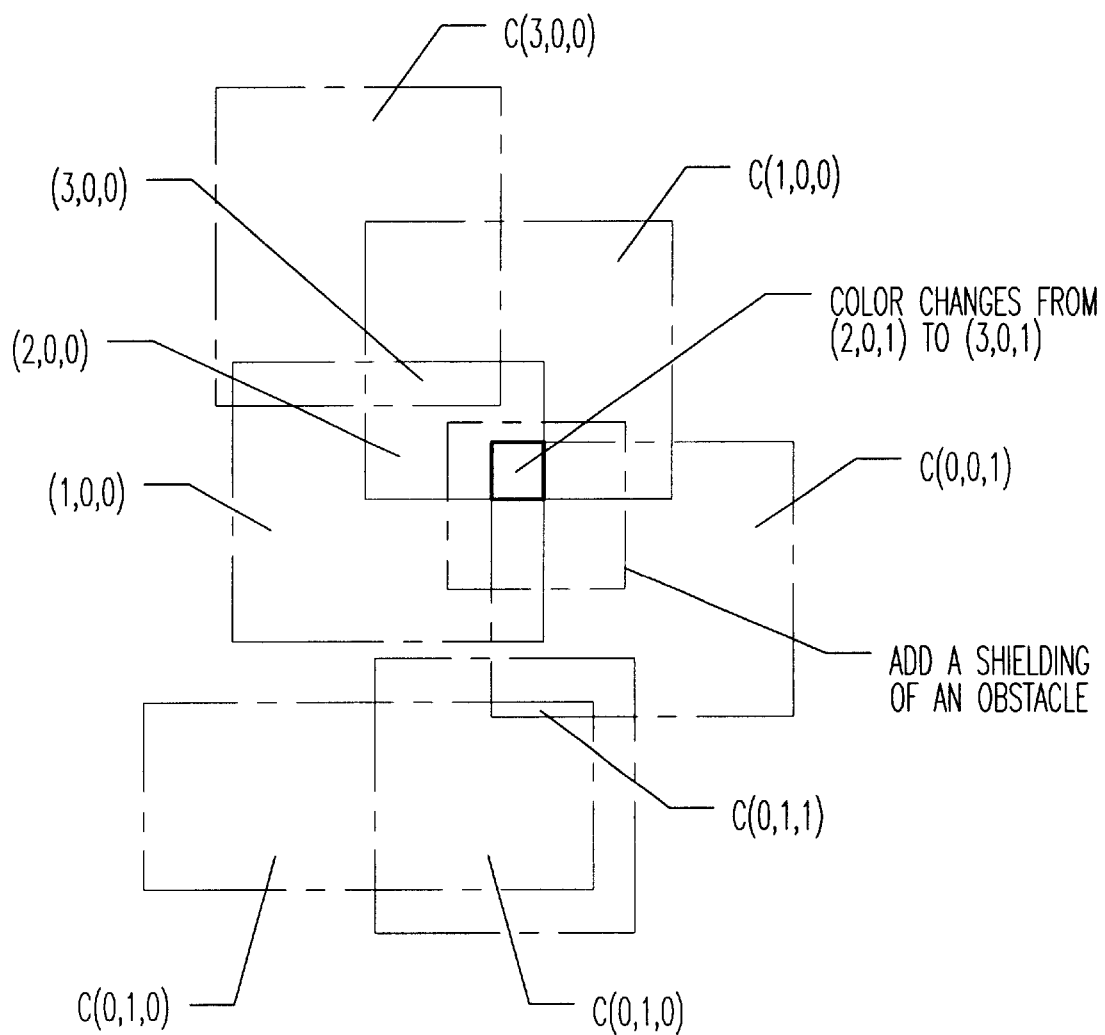
FIG. 8 is a block diagram of the shieldings shown in FIG. 7 and the color associated with a subarea of the search space after a new shielding of a new object is added to the layout model.

FIGS. 6, 7 and 8 are block diagrams of objects and shieldings in a search space of a layout. FIG. 6 is a block diagram of layout objects and their associated shieldings according to one embodiment of the present invention. Six objects are shown in FIG. 6 including an obstacle, a terminal for net A, a wire, a via enclosure and cut; a vertical obstacle, and a terminal for net B. Each object shown in FIG. 6 has an associated shielding 602, 604, 606, 608, 610 and 612.

FIG. 7 is a block diagram of the shieldings 602, 604, 606, 608, 610 and 612 shown in FIG. 6 and the color associated with the shielding according to one. embodiment of the invention. The following table summarizes the colors and saturations applied to shieldings in FIGS. 7 and 8.

| Color | Description | Saturation Level 0 | Saturation Level 1 | Saturation Level 2 | Saturation Level 3 |
|---|---|---|---|---|---|
| P1 | Relationship to read only objects | No constraints | Violates against a terminal | Violates against two or more terminals from different nets | Violates against obstacles |
| P2 | Relationship to read write objects | No constraints | Violates against a wire or via enclosure | | |
| P3 | Relationship to directional obstacle | No constraints | Violates against directional object | | |

In the simplified example shown in FIG. 7, three colors are applied to the shieldings. The colors (PI, P2, and P3) and the constraints the colors are associated with are summarized in the table above. The color of any point in the search space is written as C(p1, p2, p3). In other words, in one embodiment the color of any point in the search space is a combination of the primary colors p1, p2 and p3 that cover the point.

As shown in FIG. 7, the color of the shielding 602 for the obstacle is C(3,0,0). Referring to the example table above, the color C(3,0,0) indicates that routing within the shielding violates against an obstacle. The color of the shielding 604 for the terminal for net A is C(1,0,0) which indicates that routing within this shielding 604 violates against a terminal. The color of the shielding 606 for the wire is C(0,1,0) which indicates that routing within this shielding 606 violates against a wire. The color of the shielding 608 for the via enclosure and cut is C(0,1,0) which indicates that routing within this shielding 608 violates against a via. The color of the shielding 610 for the vertical obstacle is C(0,0,1) which indicates that routing within this shielding 604 violates against a directional obstacle. The color of the shielding 612 for the terminal for net B is C(1,0,0) which indicates that routing within this shielding 612 violates against a terminal.

In addition, several subareas of the search space shown in FIG. 7 have overlapping shieldings. The set of constraints effective in any one point of the search space is determined by a primary-color based addition of all of the colors of all of the shieldings that cover a point. In other words, when adding a shielding of color C2(p12, p22, p32) over an area with color Cl(p11, p21, p31), the resulting color becomes C(max(p11, p12), max(p21, p22), max(p31, p32)).

In this example embodiment, the higher levels of saturation dominate lower levels of saturation when applied to the same subarea of a search space. The subarea covered by shieldings 604, 612 for both the terminal for net A and the terminal for net B is assigned the color C(2,0,0) indicating that routing within that terminal violates against two or more terminals from different nets. In another example shown in FIG. 7, the subarea covered by shieldings 602, 604, 612 for both the terminal for Net A and B and for the obstacle has a resulting color of C(3,0,0). Using the primary-color based addition described in the previous paragraph, the resulting color is C(3,0,0) is arrived at as follows: C(max(1,1,3), max(0,0,0), max(0,0,0)).

In another example shown in FIG. 7, the subarea covered by shielding 604, 610, and 612 for both the terminal for Net A and B and for the vertical obstacle has a resulting color of C(2,0,1). Using the primary-color based addition, the resulting color of C(2,0,1) is arrived at as follows: C(max(1,1,0), max(0,0,0), max(0,0,1)). However, in this example the resulting saturation level for color P1 is two rather than one because routing in this subarea violates against two or more terminals. As shown in the example table above, a violation against two or more terminals from different nets is assigned a saturation level of two for color P1.

FIG. 8 is a block diagram of the shieldings shown in FIG. 7 and the color associated with a subarea of the search space after a new shielding of a new object is added to the layout model. The new shielding of the new object overlaps the subarea of the search space discussed in the previous paragraph having a color of C(2,0,1). When the new shielding having color C(3,0,0) is added as shown in FIG. 8, a resulting color of C(3,0,1) is arrived at for the subarea as follows: C(max(3,1,1,0), max(0,0,0,0), max(0,0,0,1)).

As described above, embodiments of the present invention include a coloring scheme to model the various types of information that pertain to a three dimensional (x, y, z) location in the search space. A color scheme pertaining to each location in the search space enables a detail router to create high density layouts, obey all of the design rules pertinent to the layout, and to have an accurate and efficient ripup and reroute phase. Although simplified examples were illustrated herein, layout models using the color scheme of one embodiment of the invention can be used to model any number of routing layers and can be used for gridless, variable width/spacing layouts. Furthermore, the color scheme allows for maximum use of the routing space since there is no loss due to simplistic modeling methods or abstractions. Additionally, the color scheme allows accurate modeling of the degree of design rule violation and allows for layout models to be efficiently updated.

Although specific embodiments have been illustrated and described, herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A computerized method of modeling a layout for a circuit design, the method comprising:

receiving a plurality of circuit elements;

receiving a plurality of design rules for a layout comprising the plurality of circuit elements; and generating a layout model through computer automated operations wherein one or more constraints corresponding to the plurality of design rules effective at each point in a search space of the layout model are indicated by a color associated with the point.

2. The computerized method of claim 1, further comprising searching in the layout model for a route that complies with all of the plurality of design rules.

3. The computerized method of claim 1, further comprising searching for a route in the layout model wherein the route is allowed to violate one or more of the plurality of design rules.

4. The computerized method of claim 3, further comprising modeling a gradient of the violation of the one or more design rules.

5. A computerized method of layout modeling for detail routing, the method comprising:

receiving a plurality of circuit elements and a plurality of constraints for a layout comprising the plurality of circuit elements;

associating one or more shieldings with each one of the circuit elements, wherein one or more of the plurality of constraints apply to the circuit element within the associated one or more shieldings;

assigning a first color to each one of the shieldings based on the constraints that apply within each one of shieldings;

adding each one of the shieldings to a search space for the layout; and assigning a second color to a subarea of the search space in which two or more shieldings overlap, wherein the second color is assigned using precedence rules.

6. The computerized method of claim 5 wherein the one or more shieldings are geometric representations that cover a subarea of the search space.

7. The computerized method of claim 5 wherein the first color has two or more degrees of saturation.

8. The computerized method of claim 7 wherein a higher degree of saturation represents a higher degree of violation of the constraint represented by the color.

9. The computerized method of claim 8 wherein the higher degree of saturation takes precedence over a lower degree of saturation.

10. The computerized method of claim 5 wherein precedence rules are applied to a relationship between colors.

11. An article comprising:

a computer-readable medium including instructions that when executed cause a computer to:

apply a color to each point in a layout model for detail routing, wherein the color represents information associated with the point in a search space; and apply color precedence rules to the color when two or more colors apply to a same point in the search space.

12. The article of claim 11 wherein the information associated with the location comprises constraints based on design rules.

13. The article of claim 11 wherein the color precedence rules are applied to relationships between different colors.

14. The article of claim 11 wherein the color precedence rules are applied to different saturations within a same color.

15. An article comprising:

a computer-readable medium including instructions that when executed cause a computer to:

receive a plurality of circuit elements;

receive a plurality of design rules for a layout comprising the plurality of circuit elements; and generate a layout model through computer automated operations wherein one or more constraints corresponding to the design rules effective at each point in a search space of the layout model are indicated by a color associated with the point.

16. The article of claim 15, further comprising instructions that when executed cause a computer to search in the layout model for a route that complies with all of the constraints associated with the plurality of design rules.

17. The article of claim 15, further comprising instructions that when executed cause a computer to search for a route in the layout model wherein the route is allowed to violate one or more of the constraints associated with the plurality of design rules.

18. A computerized system comprising:

a computer-readable medium;

a processor; and a computer-aided design program stored on the computer-readable medium and executable by the processor, the computer-aided design program comprising a detail router module to generate a layout model of an integrated circuit wherein the layout model generated associates one or more constraints with each point in a three-dimensional search space and wherein the one or more constraints at each point are represented by a color.

19. The computerized system of claim 18, wherein the color is combination of the colors that apply to each point.

20. The computerized system of claim 18 wherein color precedence rules are applied to relationships between different colors.

* * * * *